United States Patent [19]

Ericksen et al.

[11] Patent Number: 4,535,294
[45] Date of Patent: Aug. 13, 1985

[54] DIFFERENTIAL RECEIVER WITH SELF-ADAPTIVE HYSTERESIS

[75] Inventors: James P. Ericksen, Windsor; Timothy F. Stack, Enfield, both of Conn.

[73] Assignee: United Technologies Corporation, Hartford, Conn.

[21] Appl. No.: 468,613

[22] Filed: Feb. 22, 1983

[51] Int. Cl.³ .................. H03K 5/153; H03K 13/24; H03K 19/092
[52] U.S. Cl. .................. 328/150; 307/261; 307/358; 307/475; 328/163
[58] Field of Search ............... 307/351, 358, 359, 290, 307/475, 261; 328/151, 162, 163, 135, 150

[56] References Cited

U.S. PATENT DOCUMENTS 4,007,382  2/1977  Warberg ..................... 307/359

Primary Examiner—John Zazworsky
Attorney, Agent, or Firm—Francis J. Maguire, Jr.

[57] ABSTRACT

A conventional regenerative comparator is modified by including a transistor switch in the feedback network to open circuit the feedback path according to the output state of the comparator, and by biasing the noninverting input of the comparator with a voltage directly proportional to the amplitude of the input signal, thereby providing variable threshold comparator with a hysteresis transfer characteristic with two distinct state change threshold levels that are a fixed ratio of the amplitude of the input signal.

1 Claim, 5 Drawing Figures

DIFFERENTIAL RECEIVER WITH SELF-ADAPTIVE HYSTERESIS

DESCRIPTION

1. Technical Field

This invention relates to differential signal receivers and more particularly to differential receivers with signal noise immunity.

2. Background Art

As is known in the art, the use of a differential receiver, i.e., a signal receiver having a differential amplifier input, in noisy environments provides a high common mode rejection ratio (CMRR). The common mode rejection eliminates the common noise factors superimposed on both nodes or inputs to the input amplifier but does not affect individual node induced noise. Typically, the prior art provides a hysteresis transfer function for the differential receiver. The transfer characteristic of a regenerative comparator is in the form of a hysteresis loop and is ideal for this purpose as it provides noise immunity by setting the loop input state change thresholds as a function of its signal output state. Once an output level has been established, small variations at the input to the regenerative comparator do not cause erroneous state changes at the output. Thus, the regenerative comparator "remembers" its present output state and will not switch to the alternate output state unless the input voltage changes to a value substantially different from the value that initiated its present state.

The size, shape, and position of the hysteresis loop on the transfer characteristic is fixed based on the anticipated nominal voltage value of the input signal. Since, in the conventional application, the nominal amplitude of the input signal is the same for all cases, a fixed hysteresis loop can be incorporated and the noise immunity optimized. However, the capability of the differential receiver is thus necessarily restricted to the reception of input data having a single nominal voltage magnitude.

DISCLOSURE OF INVENTION

The object of the present invention is to provide a noise immune differential receiver with a self-adaptive hysteresis loop transfer function whose size and position on the transfer characteristic is proportional to the present amplitude of the receiver input signal and whose output is compatible to TTL logic.

According to the present invention, a noise immune differential receiver includes a self-adaptive hysteresis circuit having a modified regenerative comparator with a switch in the feedback path for opening and closing the feedback path according to the output state of the comparator, and for providing the comparator with hysteresis state change threshold levels as a function of a variable DC voltage bias which is proportional to the present received input signal peak value, thereby providing the modified regenerative comparator with a hysteresis characteristic loop which varies in size and position according to the present peak amplitude of the received input signal. The variable DC voltage is also used to convert the input data from a bipolar signal to a unipolar signal. The variable DC voltage is also used by a translator comparator which compares the output of the modified regenerative comparator to a reference voltage proportional to the variable DC voltage. In this way, the input data is translated to a level compatible to the logic circuitry.

The use of a varying bias and of a switch in the feedback path results in a modified regenerative comparator having a variable hysteresis loop that varies its state change threshold levels according to variations in the amplitude of the input signal. Thus, the conventional hysteresis noise suppression technique is modified for use in a differential receiver that may receive input signal data having widely varying nominal input voltage amplitudes and which is compatible to TTL logic.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 2:
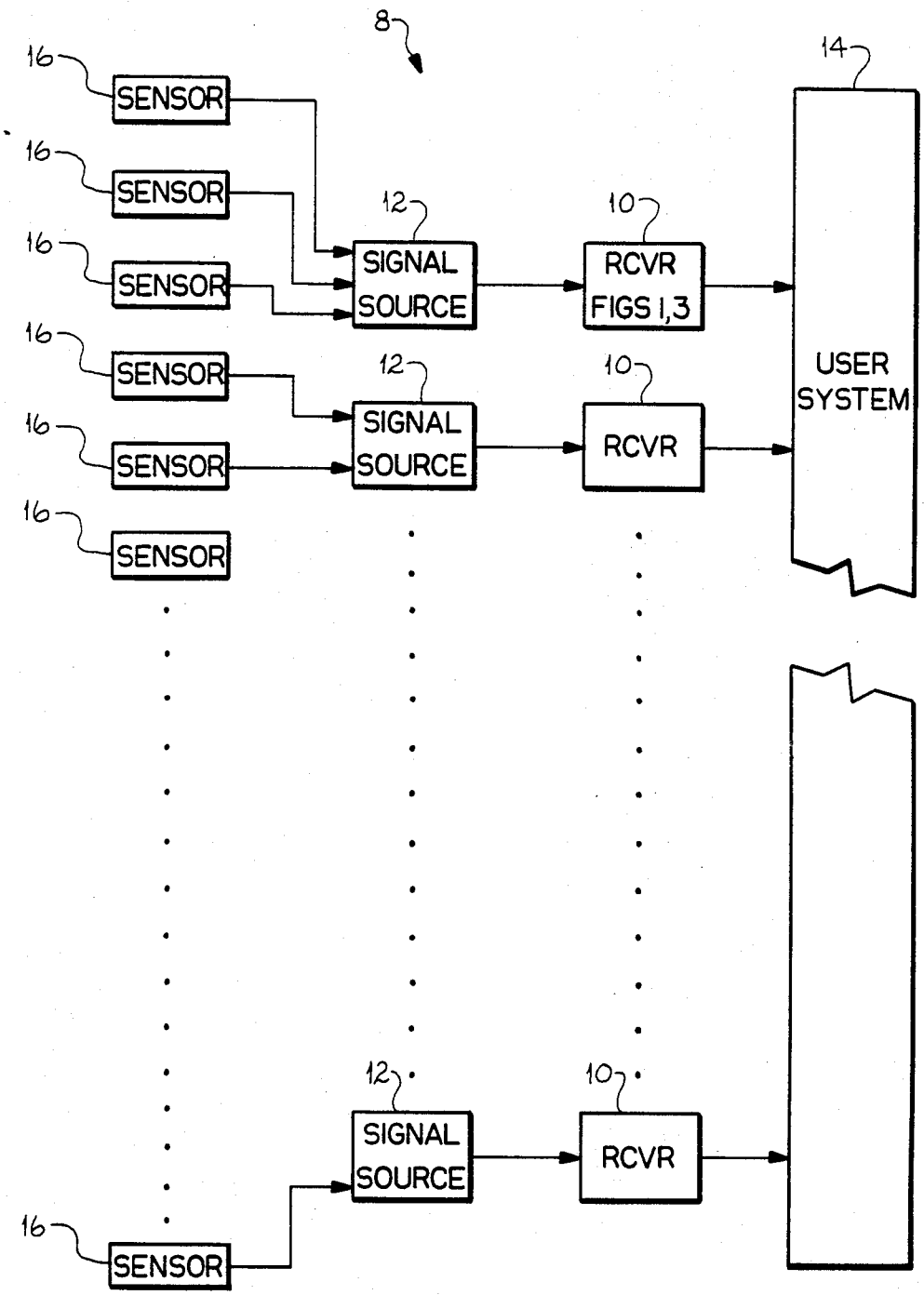
FIG. 2 is a simplified block diagram of a data acquisition system that includes the invention.

FIG. 2 illustrates a data acquisition system 8 in which differential receivers 10 according to the present invention may be used for conditioning signals received from signal sources 12 and presenting a conditioned signal to a user system 14. The function of the receiver 10 is to reject noise that may appear on signals received from the signal source and to translate the received signals into a form compatible with the user system. The signal source may receive input signals from a multiplicity of sensors 16. A single user system 14 may utilize a multiplicity of signal sources, receivers, and sensors as shown.

Figure 3:
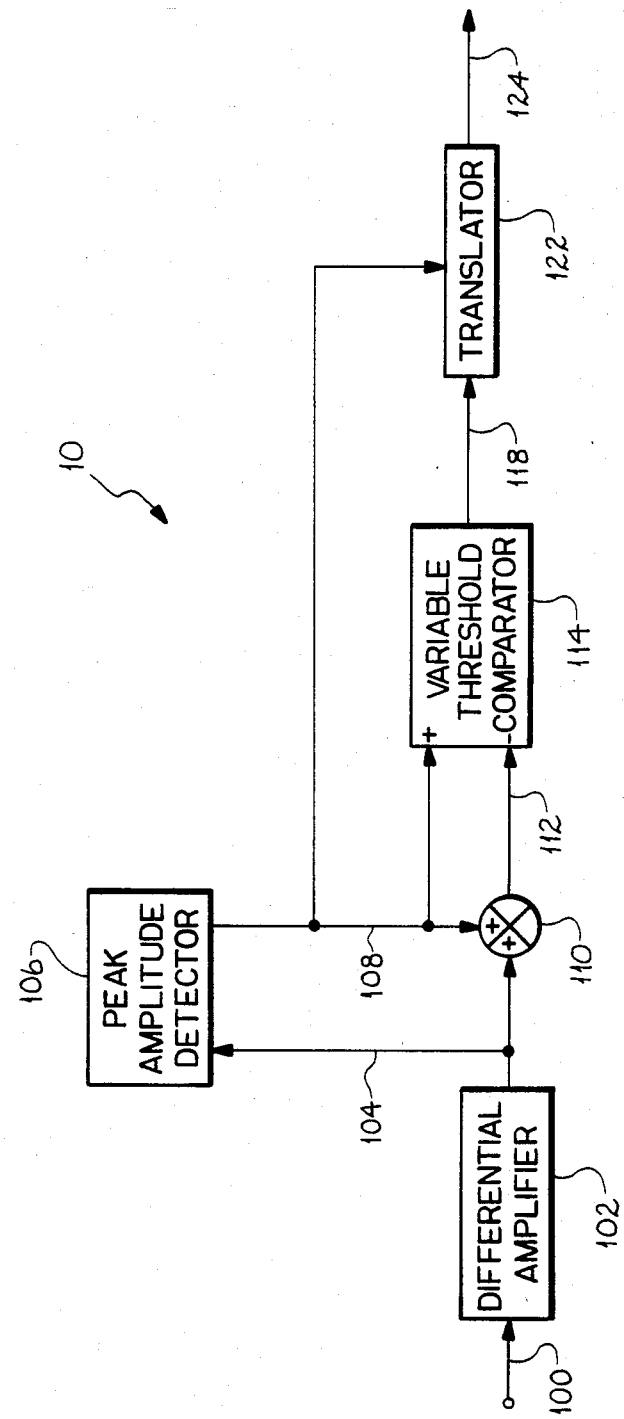
FIG. 3 is a simplified block diagram of a best mode embodiment of the differential receiver with self-adaptive hysteresis.

FIG. 3 is a block diagram of the present invention differential receiver 10 which receives an input differential signal from a source on a differential line 100. The input signal is received from the line 100 by differential amplifier 102 which rejects common mode input signal noise, amplifies and conditions the input signal and presents the conditioned signal at an output on a line 104. The amplifier 102 rejects only common mode noise such that the output signal still contains some single mode noise which cannot be rejected by the differential interface. An amplitude detector 106 receives the conditioned input signal on the line 104 and provides a variable DC output voltage signal on a line 108; the DC output voltage signal is a variable bias signal having a present signal magnitude which is directly proportional to the present peak amplitude of the conditioned signal on the line 104. The line 108 variable DC voltage signal is presented through a summing junction 110, which sums the DC signal together with the conditioned signal on the line 104. The summed signal on a line 112 is presented to the inverting input of a variable threshold comparator 114. The variable DC voltage signal is also presented to the noninverting input of the comparator. Since the feedback signal will vary according to the level of the DC voltage on the line 108 provided by the detector 106, the input state change threshold levels of the hysteresis loop on the transfer characteristic of the comparator 114 will vary in direct proportion to the present amplitude of the input signal on the line 100. The receiver 10 may thus be utilized in a data acquisition system that interfaces with different signal sources having widely varying output signal voltage amplitudes.

The output of the amplitude detector 106 on the line 108 is also utilized by a translator 122 which compares the output of the variable threshold comparator on the line 118 to the DC level on the line 108 and produces an output voltage on the line 124 which is compatible with the logic it feeds.

Figure 1:
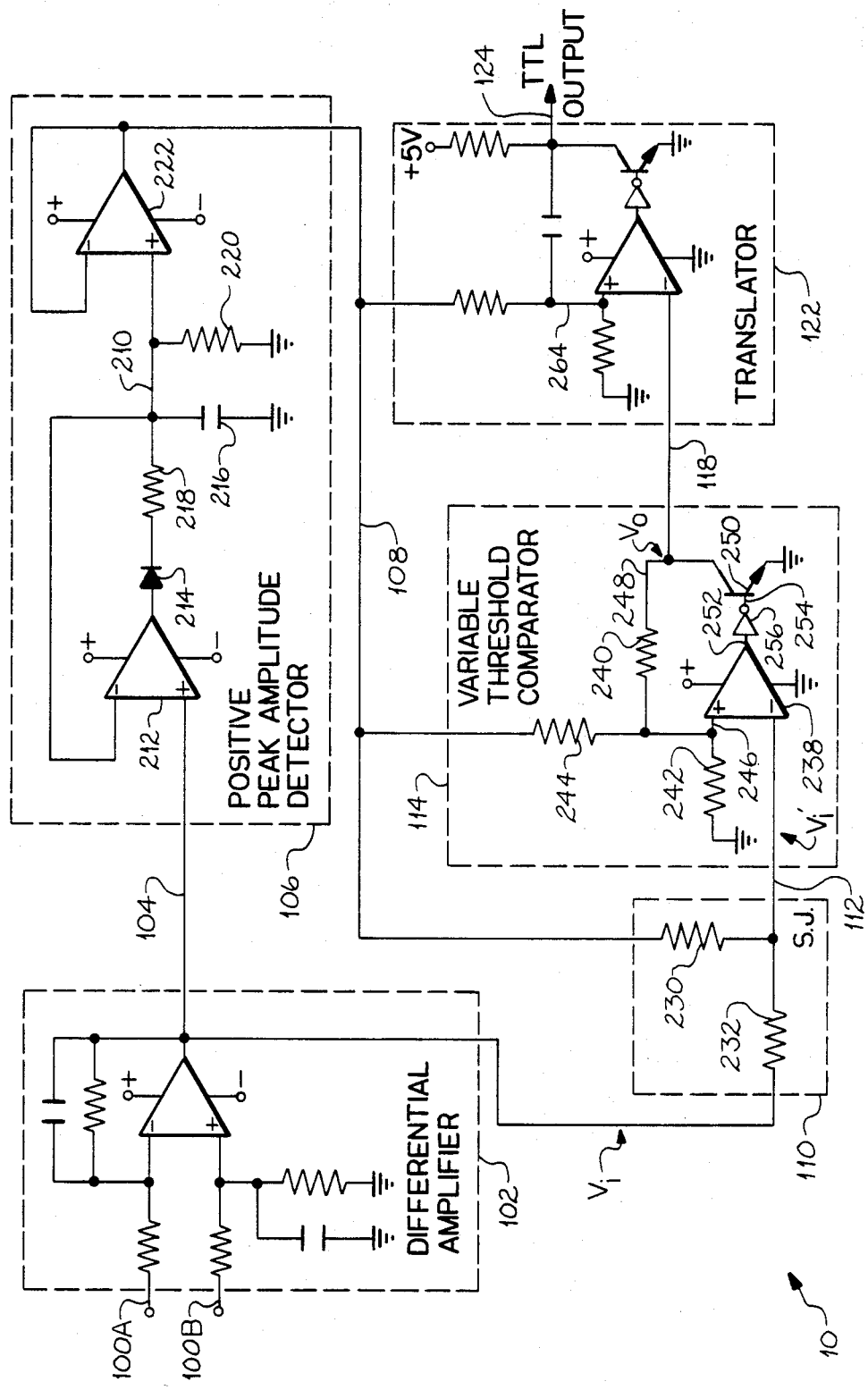
FIG. 1 is a schematic diagram of a best mode embodiment of the differential receiver with self-adaptive hysteresis.

FIG. 1 is a schematic diagram of the present differential receiver with self-adaptive hysteresis 10.

A bipolar input signal between lines 100A, 100B is received differentially by the differential amplifier 102 which differentially receives and filters the input signal. The output signal on the line 104 is illustrated by waveform 207 of FIG. 4, illustration (a).

Figure 4:
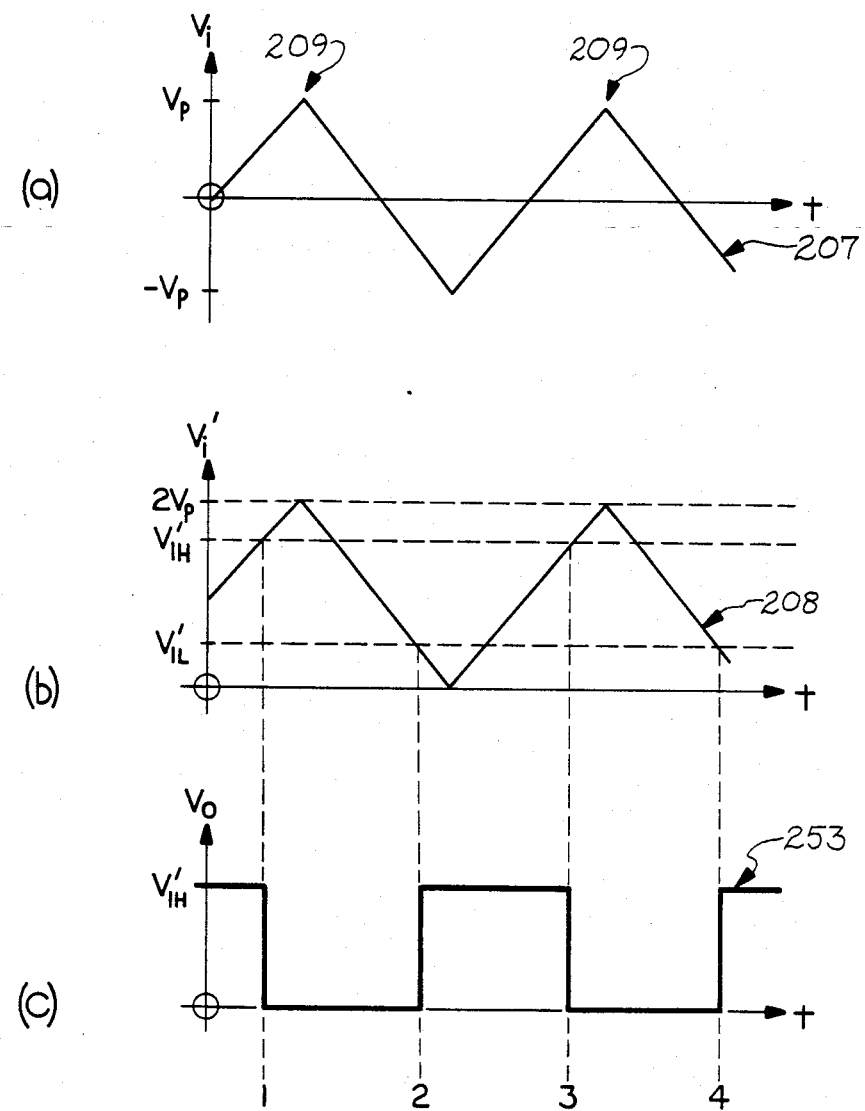
FIG. 4 is a sketch of several waveforms.

Referring back to FIG. 1, the signal on the line 104 is presented to the detector 106 which determines the positive peak amplitude 209, as shown in FIG. 4 illustration (a), of the signal on the line 104. Whenever the voltage on the line 104 is higher than the voltage on a line 210, a comparator 212 will cause a diode 214 to be forward biased, charging a capacitor 216 at a rate determined by the time constant of the capacitor 216 and a resistor 218. Whenever the voltage on the line 104 is lower than the voltage on the line 210, the diode 214 will be reverse-biased, and no conduction takes place. In this way, the capacitor 216 rapidly charges up to the peak voltage on the line 104. If the present peak value on the line 104 changes, the DC voltage on the line 210 will change commensurately, any increases being reflected by an increased state of charge on the capacitor 216 and any decreases by a decreased state of charge, the excess being discharged through the resistor 220. The DC voltage signal on the line 210 is buffered by an amplifier 222 to produce the DC output signal on the line 108 which is presented to the summing junction 110, including resistors 230, 232. The summing junction produces a unipolar output signal on the line 112 which is proportional to the bipolar signal on the line 104 as illustrated by illustrations (a) and (b) in FIG. 4. Waveform 207 illustrates the bipolar input signal and waveform 208 shows the unipolar signal on line 112.

Referring back to FIG. 1, the unipolar signal on line 112 ($v_i'$) is presented to the inverting input of a voltage comparator 238 where it is compared, at the noninverting input, to a signal on a line 246. The signal on the line 246 is provided by a voltage divider that changes its voltage division ratio according to the output of the comparator 238. When the output voltage on a line 252 of the comparator 238 is in the positive state the output voltage on a line 254 of an inverter 256 is in the negative state, the transistor 250 is "off", the collector is open circuited, and the signal on the line 246 is produced by the voltage division of the voltage on the line 108 provided by resistors 242, 244. When the output voltage on the line 252 is in the negative state the output voltage on the line 254 is in the positive state, the transistor 250 is "on", the collector is essentially grounded, and the feedback signal on the line 246 is produced by the voltage division of the voltage on the line 108 provided by the resistor 244 and the resistors 242, 240 in parallel.

The reference voltage on the line 246 is thus changed from one distinct high value to another distinct low value each time the variable threshold comparator changes its output state. The two distinct values correspond to two distinct fixed percentage values of the input signal. The percentage values are fixed based on the resistance values chosen for the resistors 240, 242, 244 and the percentage value at any given moment depends on whether the resistor 240 is open circuited by the transistor 250. The comparator input waveform 208 ($v_i'$) is illustrated in waveform (b) of FIG. 4. The voltage levels designated as $V_{IH}'$ and $V_{IL}'$ on the ordinate represent the two distinct fixed percentage values discussed above and correspond to the two distinct reference values on the line 246 of FIG. 1.

Comparison of the input waveform 208 as shown in illustration (b) of FIG. 4 with the output waveform 253 ($v_o$) as shown in illustration (c) reveals that the two distinct reference values on the line 246 of FIG. 1 directly influence the manner in which the output changes state. For example, prior to point 1 on the abscissa of illustrations (b) and (c) of FIG. 4, the output waveform 253 is in its "high" state and remains "high" until the input waveform 208 exceeds the high reference value corresponding to $V_{IH}'$, at which point it changes to its "low" state. Even though the input signal subsequently decreases below the $V_{IH}'$ value, the output "remembers" its present state and stays "low" until the input signal decreases below the $V_{IL}'$ value, at which point it changes back to its "high" state at point 2. Similarly, even though the input waveform 208 increases above the value $V_{IL}'$ between points 2 and 3, the output "remembers" its present state and stays "high" until the input signal increases above the $V_{IH}'$ value, at which point it changes back to its "low" state at point 3. The transition from the "low" state to the "high" state at point 4 occurs in the same manner as it did at point 2.

Figure 5:
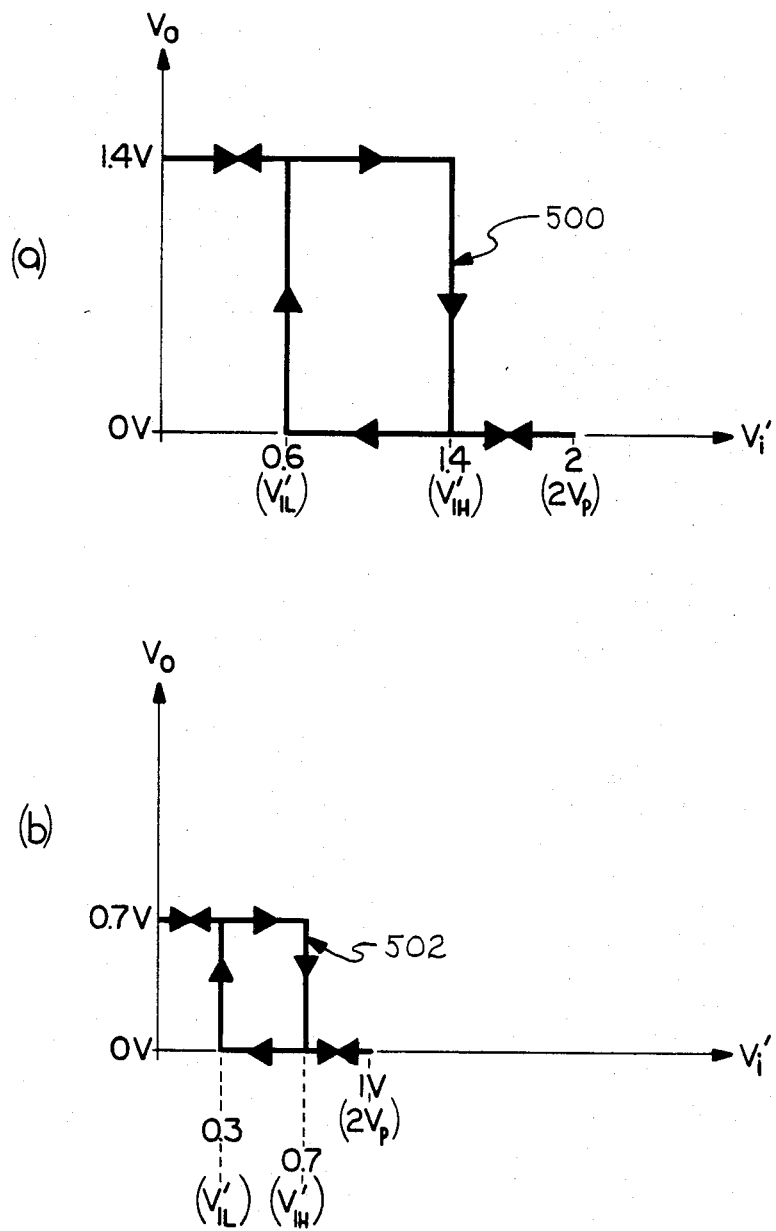
FIG. 5 is a sketch of the transfer function of the variable threshold comparator showing two possible hysteresis loops corresponding to two different input signal amplitudes.

Referring back to FIG. 1, since the signal on the line 246 is provided as two distinct fixed percentage parts of the value of the input signal on the line 104, a variable threshold comparator 114 having a self-adaptive hysteresis characteristic is thereby provided. For example, if the positive peak value ($V_p$) of the input signal 104 ($v_i$) is 1 volt such that the peak to peak value of the unipolar signal ($v_i'$) equals 2 volts and the values of resistors 240, 242, 244 are such that the voltage division values are 0.7 with transistor switch 250 "off" and 0.3 with the switch "on", then the voltage on the line 246 will equal 1.4 volts when it is in its "high" state and the transfer characteristic of the variable threshold comparator 114 will appear as is shown in illustration (a) of FIG. 5. The hysteresis loop 500 is shown having an aspect ratio, defined as the ratio of the height of the loop to its width, of 1.75. As may be seen by comparing the waveforms 208, 253 illustrated in FIG. 4 illustrations (b) and (c), the hysteresis loop 500 in FIG. 5 illustration (a) is a plot of the FIG. 4 voltage values of waveform 208 against waveform 253. Both the low ($V_{IL}'$) and the high ($V_{IH}'$) voltage values that trigger the output voltage ($v_o$) state changes remain constant as long as the peak amplitude of the input signal remains the same. If, for example, a different input signal ($v_i$) having a peak amplitude ($V_p$) of only ½ volt is received, the size and position of the hysteresis loop changes, as is shown in illustration (b) of FIG. 5. However, the aspect ratio of loop 502 remains the same as that of loop 500, i.e., a value of 1.75.

Referring now to FIG. 1, the comparator output on line 118 is presented to the translator 122 which translates the signal level to a logic compatible signal level on the line 124. Since the nominal output voltage of the signal on the line 118 varies according to the magnitude of the input signal on the line 104, the voltage on the line 264 must also vary so that the comparison level shifts commensurately with a change in the magnitude of the input voltage on the line 104.

Even though only two hysteresis loop characteristics of the variable threshold comparator of the present invention are illustrated in FIG. 5, it should be understood that the loop is infinitely variable with input signal peak amplitudes. As may be expected, the differential receiver is adaptable to all input signal conditions to provide an equal variety of hysteresis loop characteristics; each changing its size and position in direct proportion to the peak amplitude of the input signal. It should also be understood that the aspect ratio of the hysteresis loops may be changed by changing the values of the resistors 240, 242, 244.

It should also be understood by those skilled in the art that although the best mode embodiment is shown receiving a bipolar input signal, a unipolar signal could also be received, thus obviating the need for a summing junction to convert the input signal from bipolar to unipolar. The invention is therefore not limited to receiving bipolar signals only. Similarly, although the invention has been shown and described with respect to a best mode embodiment thereof, it should be understood by those skilled in the art that the foregoing and various other changes, omissions and additions in the form and detail thereof may be made therein without departing from the spirit and scope of this invention.

We claim:

1. Apparatus for providing unipolar conditioned output signal manifestations of a varying peak-to-peak amplitude bipolar input signal, comprising:

differential amplifier input means having two input nodes, responsive to the bipolar input signal at said input nodes for providing at an output node a bipolar first conditioned signal representative of the input signal having common mode noise rejected;

peak detector means responsive to said first conditioned signal for providing a bias voltage signal at an output node thereof at a present magnitude directly proportional to a present peak amplitude of said first conditioned signal;

summing means, responsive to said first conditioned signal and to said bias voltage signal for summing said first conditioned signal and said bias voltage signal thereby converting said first conditioned signal to a unipolar second conditioned signal;

comparator means, having a two-state output signal and having noninverting and inverting signal inputs with said inverting signal input responsive to said second conditioned signal and with said noninverting signal input responsive to said bias voltage signal at a first gain value in the presence of a first output state caused by a noninverting signal input magnitude greater than an inverting signal input magnitude and responsive to said bias voltage signal at a second gain value in the presence of a second output state caused by an inverting signal input magnitude greater than a noninverting signal input magnitude;

inverter means, responsive to said two-state output signal for providing inverted first and second output state signals;

switching means, responsive to said inverted first and second output state signals for providing a conditioned output signal and for providing an effective ground path at a switched output node thereof in the presence of said inverted second output state and for opening said effective ground path in the presence of said inverted first output state;

variable voltage divider means, having three resistive legs with a common node connected to said noninverting input and having a first leg connected to said peak detector output node, a second leg connected to ground, and a third leg connected to said switching means' switched output node, said variable voltage divider means responsive to the switched state of said switching means for providing a voltage dividing network having said first leg in series with said second leg only in the presence of said inverted first output state and having said first leg in series with said second and third legs in parallel in the presence of said inverted second output state; and signal level translator means, responsive at a first input to said conditioned output signal and responsive at a second input to said bias voltage signal for translating said conditioned output signal to a conditioned output signal manifestation compatible with TTL logic.

* * * * *